United States Patent [19]
Chen et al.

[11] Patent Number: 6,110,284
[45] Date of Patent: Aug. 29, 2000

[54] APPARATUS AND A METHOD FOR SHIELDING LIGHT EMANATING FROM A LIGHT SOURCE HEATING A SEMICONDUTOR PROCESSING CHAMBER

[75] Inventors: Chen-An Chen, Sunnyvale; Henry Ho, San Jose; Steven A. Chen, Fremont, all of Calif.

[73] Assignee: Applied Materials, Inc., Santa Clara, Calif.

[21] Appl. No.: 09/004,820

[22] Filed: Jan. 9, 1998

[51] Int. Cl.$^7$ ..................................................... C23C 16/00
[52] U.S. Cl. ........................ 118/715; 118/725; 118/728; 118/729; 118/730; 438/717; 438/942; 250/492.2; 250/515.1
[58] Field of Search ..................................... 118/719, 721, 118/723 R, 724, 725, 728, 730, 729; 438/707, 710, 717, 942; 250/492.2, 492.22, 515.1, 517.1; 428/432, 34.4, 34.6, 36.91

[56] References Cited

U.S. PATENT DOCUMENTS

| | | |
|---|---|---|
| 2,223,118 | 11/1940 | Miller . |
| 2,858,451 | 10/1958 | Silversher . |
| 3,882,901 | 5/1975 | Seiler et al. . |
| 3,925,583 | 12/1975 | Rau et al. . |
| 4,041,872 | 8/1977 | McCown et al. . |
| 4,550,245 | 10/1985 | Arai et al. . |
| 5,562,774 | 10/1996 | Breidenbach et al. . |
| 5,583,318 | 12/1996 | Powell . |
| 5,589,003 | 12/1996 | Zhao et al. . |
| 5,660,472 | 8/1997 | Peuse et al. . |
| 5,781,693 | 7/1998 | Ballance et al. . |

*Primary Examiner*—Stanley S. Silverman
*Assistant Examiner*—Michael P. Colaianni
*Attorney, Agent, or Firm*—Blakely Sokoloff Taylor & Zafman

[57] ABSTRACT

A semiconductor processing system comprising a semiconductor processing chamber, a light, a temperature detector, and a member. The light is positioned to heat the confines of the chamber. The temperature detector measures the temperature at the location within the chamber. The member has a translucent quartz shell and opaque core and shields the location from light emanating from the light source.

16 Claims, 3 Drawing Sheets

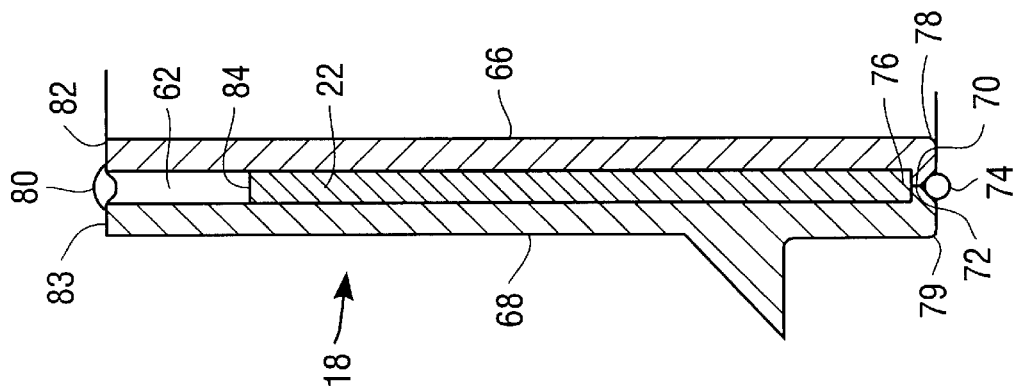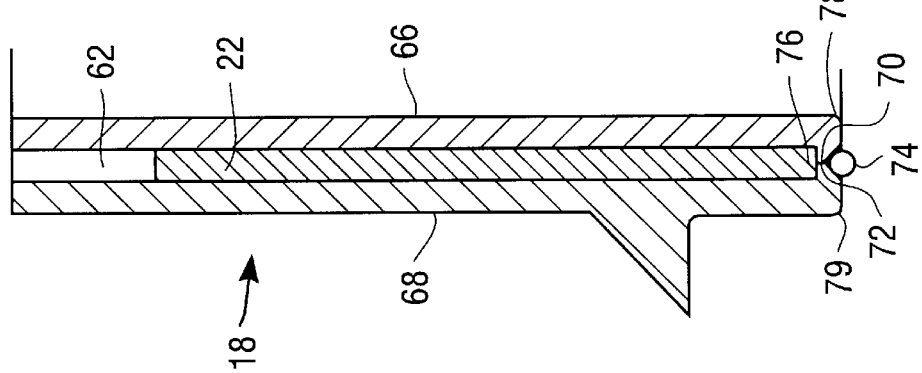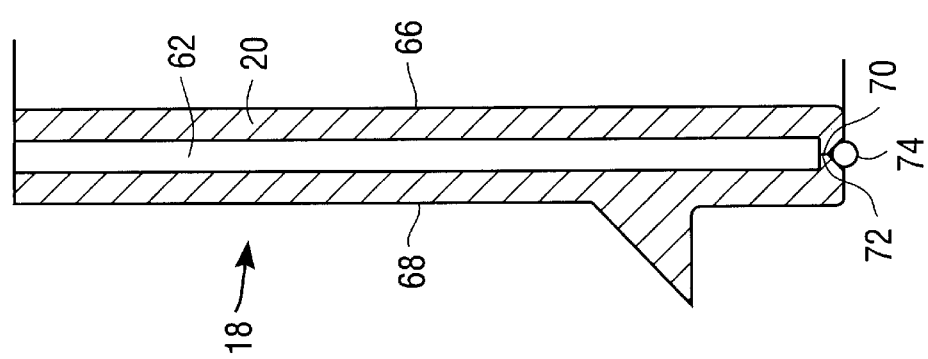

6,110,284

APPARATUS AND A METHOD FOR SHIELDING LIGHT EMANATING FROM A LIGHT SOURCE HEATING A SEMICONDUTOR PROCESSING CHAMBER

BACKGROUND OF THE INVENTION

1. Field of the Invention

The invention relates to a semiconductor processing system and to a method wherein light emanating from a light source is shielded from reaching a temperature detector.

2. Discussion of Related Art

Semiconductor devices are manufactured by locating a semiconductor wafer within respective semiconductor processing chambers and conducting respective processing steps on the wafer. A light source is usually positioned to heat the wafer when located within such the chamber. A temperature detector, such as a pyrometer, detects the temperature at a location within the chamber, such as on a surface of the wafer. It may be necessary to shield the temperature detector from light emanating from the light source so that an accurate temperature signal is received from the temperature detector. Such a signal may then be used for purposes of controlling power supplied to the light source.

Various components within the chamber serve to block light emanating from the light source. These components are made from different materials for different purposes. For example, the materials may have to be resistant to reaction with chlorine since chlorine is often used for cleaning such a semiconductor processing chamber. Not many materials comply with both effective light blocking characteristics and resistance to reaction with chlorine. Quartz is a material which is resistant to chlorine, although quartz is translucent and would therefore not comply with required light blocking characteristics. Wafer seats, usually provided within the semiconductor processing chamber, are often made from graphite which is covered by silicon carbide. Such a seat has both effective light blocking characteristics and resistance to reaction with chlorine.

A component, having magnetic characteristics, is also sometimes located within the semiconductor processing chamber for purposes of supplying movement to the wafer. The component may, for example, be a rotor which is linked to the wafer seat by means of a member so that rotational movement of the member causes the seat, and therefore the wafer, to rotate. Some materials which are used for such components lose their magnetic characteristics once they reach elevated temperatures, typically above 100° C. Any member thus linking the wafer seat to the component is therefore required to have a low thermal conductivity in order to protect the component from heat which builds up at the seat. A material with low thermal conductivity is quartz although quartz, as mentioned, is translucent and would not comply with required light blocking characteristics.

A semiconductor processing system is thus required which includes a member shielding light, emanating from a light source, from reaching a temperature detector, wherein the member is also resistant to reaction with chlorine and preferably also has a low thermal conductivity.

SUMMARY OF THE INVENTION

The invention relates to a semiconductor processing system comprising a semiconductor processing chamber, a light source, a temperature detector, and a member located within the chamber. The light source is positioned to heat a wafer when located in the chamber. The temperature detector measures a temperature at a location within the chamber. The member shields the location from light emanating from the light source. The member has a translucent shell and an opaque core.

BRIEF DESCRIPTION OF THE DRAWINGS

The invention is further described by way of example with reference to the accompanying drawings wherein:

FIGS. 3 is a sectioned side view of a translucent shell of a light shield according to the invention;

FIG. 4 is a sectioned side view of the shell of FIG. 3 after insertion of an opaque core; and FIG. 5 is a sectioned side view of the shell and the core of FIG. 4 after application of a fusion weld.

DESCRIPTION OF PREFERRED EMBODIMENT

In the following description, for purposes of explanation, numerous details are set forth in order to provide a thorough understanding of the present invention. However, it will be apparent to one skilled in the art that these specific details are not required in order to practice the present invention. Certain specifics regarding, for example, apparatus, materials, and methods of construction are recited. These specifics are recited in order to provide an example of a workable embodiment of the invention, and may be altered according to preference or requirement without departing from the broader scope of the invention.

The following description relates to apparatus and methods wherein light is blocked within a semiconductor processing chamber. A light source is located to heat a wafer within the chamber. A temperature detector detects a temperature on the wafer. A member with a translucent quartz shell and an opaque core blocks light emanating from the light source so that the light does not affect the temperature detector.

Figure 1:
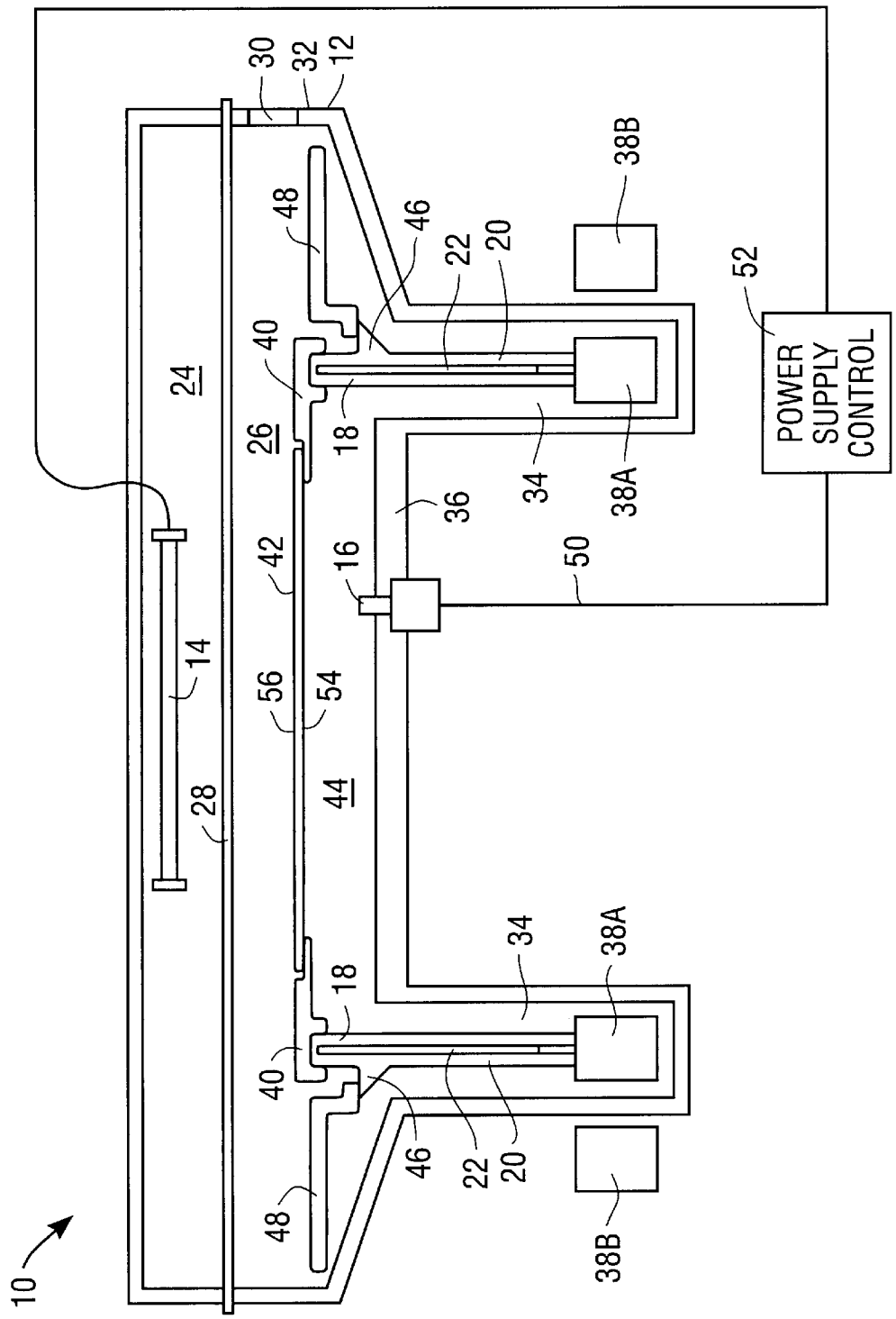
FIG. 1 is a sectioned side view of a semiconductor processing system according to the invention.

FIG. 1 of the accompanying drawings illustrates a semiconductor processing system 10 which includes semiconductor processing chamber 12, a halogen light 14, a pyrometer 16, and a vertically extending tubular member 18 which shields light emanating from the halogen light 14 from reaching the pyrometer 16.

The tubular member 18 has a wall with a translucent quartz shell 20, and an opaque core 22 extending along the length of the member. The terms "translucent" and "opaque" are used freely herein. The terms "translucent" and "opaque" should be interpreted with respect to the light source 14 used. If a light source 14 is used which emanates electromagnetic radiation within the optical frequency range, then the terms "translucent" and "opaque" should be interpreted as being translucent or opaque to light within the optical frequency range. If a light source 14 is used which emanates light at frequencies outside the optical frequency range, then the terms "translucent" and "opaque" should accordingly be interpreted as being translucent or opaque to that frequencies, being outside the optical range. A halogen light 14 is described in the present embodiment. A halogen light 14 emanates light at frequencies between $10^{14}$ Hz and $10^{15}$ Hz.

The semiconductor processing chamber 12 is made of conventional 316 stainless steel and comprises an upper portion 24 and a lower portion 26 with a transparent quartz window 28 separating the upper portion 24 and the lower portion 26. The halogen light 14 is located in the upper portion 24 and shines light through the window 28 into the lower portion 26. The lower portion 26 is formed with a slit 30 in a side wall 32 thereof for purposes of inserting a semiconductor wafer. A circular channel 34 is provided in a lower wall 36 of the lower portion 26. A rotor 38A and a magnet 38B are located respectively within the channel 34 and around the channel 34. The rotor 38A is suspended within the channel 34 by the magnet 38B and the member 18 is partially located within the channel 34 and rests on the rotor 38A.

A ring-shaped wafer seat 40 rests on the tubular member 18. A wafer 42 is located on the wafer seat 40 so that the tubular member 18, the wafer seat 40 and the wafer 42 form a housing 44. The pyrometer 16 extends through the lower wall 36 into the housing 44. The pyrometer 16 is thus shielded from light emanating from the halogen light 14 by means of the tubular member 18, the wafer seat 40 and the wafer 42 jointly.

The tubular member 18 is formed with a ledge 46 around an outer circumference thereof. A shield ring 48 rests on the ledge 46.

The pyrometer 16 is positioned to detect a temperature on a lower surface 54 of the wafer 42. A signal 50 from the pyrometer 16 is fed into a power supply control 52 which controls the power supplied to the halogen light 14. The halogen light 14 in turn heats an upper surface 56 of the wafer 42.

While the wafer 42 is being heated, the rotor 38A is rotated by the magnet 38B so as to turn the tubular member 18. Since the wafer seat 40 rests on the tubular member 18 and the wafer 42 rests on the wafer seat 40, rotation of the rotor 38A will also cause rotation of the wafer 42. The wafer is rotated so that it is uniformly processed and uniformly heated.

Figure 2:
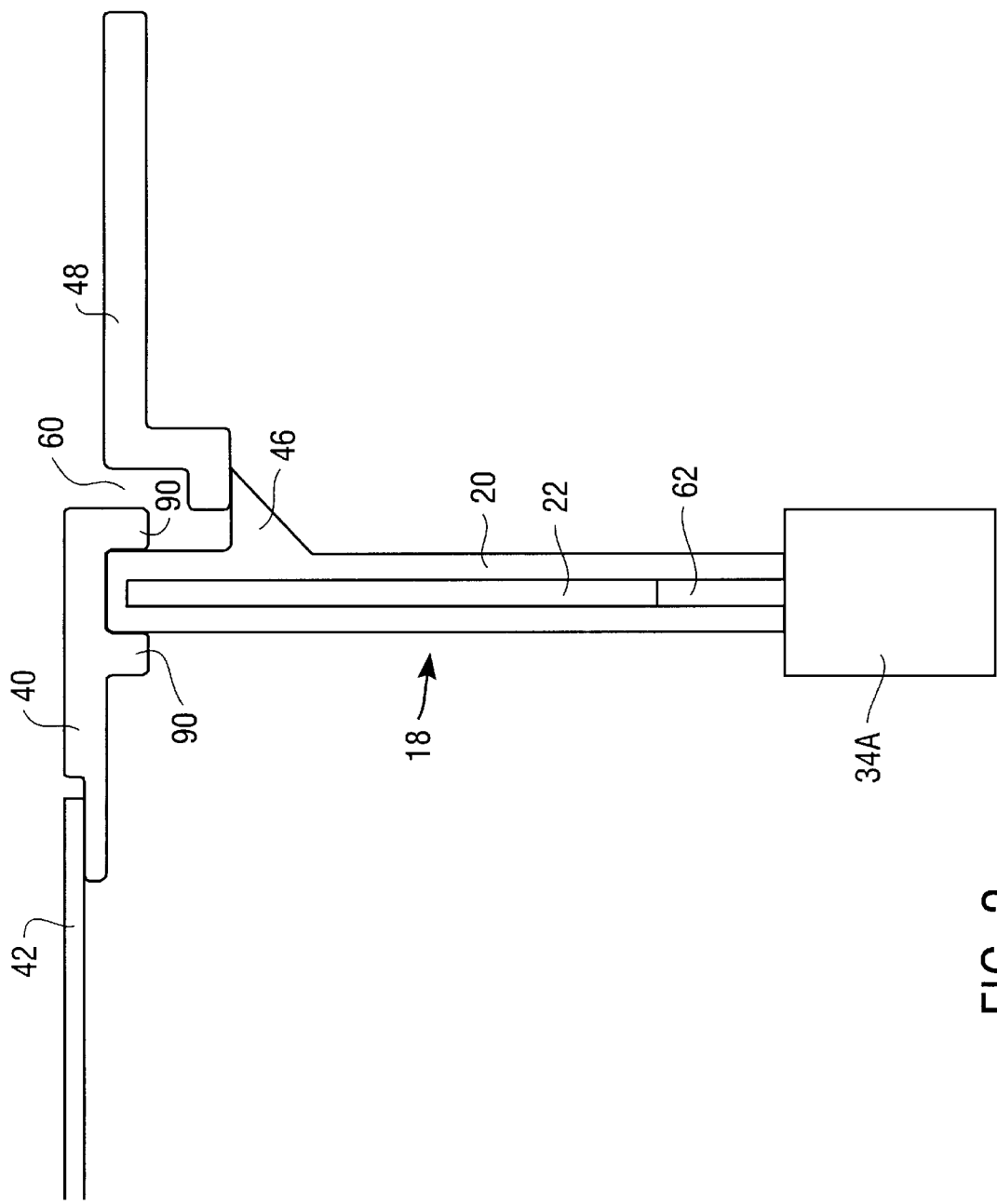
FIG. 2 is an enlarged sectional side view of parts of the system of FIG. 1.

FIG. 2 is an enlarged view of the rotor 38A, the tubular member 18, the wafer seat 40, the wafer 42, and the shield ring 48.

A passage 60 is defined between opposing surfaces of the wafer seat 40 and the shield ring 48. The passage 60 extends downwardly and terminates against the tubular member 18. Light emanating from the halogen light 14 can thus pass through the channel 60 and reach an outer surface of the tubular member 18. The tubular member 18 should thus shield light, emanating from the halogen light 14, which passes through the channel 60 so that the light does not affect the pyrometer 16.

The tubular member 18 should preferably have a low thermal conductivity. The wafer 42 and the wafer seat 40 are both heated by the halogen light 14. The wafer seat 40 is made of graphite with a silicon carbide coating. Graphite has a thermal conductivity of 95.6 W/m° K and silicon carbide has a thermal conductivity of between 75 W/m° K and 155 W/m°K. The wafer seat 40 thus has a relatively high thermal conductivity. The tubular member 18 links the wafer seat 40 with the rotor 38A. The rotor 38A is made of 17-4 PH stainless steel. 17-4 PH stainless steel consists of iron, chromium, copper and nickel and is a steel with a martensitic phase. Once 17-4 PH stainless steel reaches a high temperature, in particular above 100° C., it loses its ability to be magnetized. Once the rotor 38A thus reaches a temperature above 100° C. it will lose its ability to be rotated by the magnet 38B. The tubular member 18 should thus preferably have a thermal conductivity which is low enough so that the heat of the wafer seat 40 does not reach the rotor 38A.

The tubular member 18 should also preferably be resistant to attack from the primary materials which are normally used for cleaning such a semiconductor chamber, in particular chlorine.

The shell 20 is made of quartz. Quartz is resistant to reaction with chlorine and has a relatively low thermal conductivity of about 1.4 W/m° C. Quartz is thus a suitable material for the shell 20 for purposes of keeping the heat of the seat 40 away from the rotor 38A, and as a material which can be used in a chamber which is cleaned with chlorine.

Quartz, however, is a translucent material. For that reason, an opaque core 22 is located within the quartz shell 20. The core 22 may be made of any suitable opaque material and is typically made of sheet metal which can be formed and contorted to conform to a cavity 62 which is provided within the shell 20. The core 22 thus prevents light, traveling through the channel 60, from passing through the tubular member 18 and reaching a location where the pyrometer detects temperature, in particular on the lower surface 54 of the wafer 42. By preventing light from reaching the location, an accurate signal 50 can be transmitted to the power supply control 52 and the halogen light 14 can be properly controlled.

FIG. 3 illustrates the shell 20 before the core 22 is inserted into the cavity 62. The shell 20 comprises an inner tube 66 and an outer tube 68 with the cavity 62 defined between the respective tubes 66 and 68. The tubes 66 and 68 have contacting surfaces 70 and 72 which are relatively short. The tubes 66 and 68 are fused together with a fusion weld 74 at the contact surfaces 70 and 72. As shown in FIG. 4, the core 22 is then inserted into the cavity 62. A first end 76 comes fairly close to first ends 78 and 79 of the tubes 66 and 68, so close that the first end 76 would melt if the core 22 would be inserted into the cavity 62 and the fusion weld 74 is then applied.

As shown in FIG. 5, another fusion weld 80 is then applied which joins second ends 82 and 83 of the tubes 66 and 68. The core 22 is totally encapsulated by the shell 20 so as to prevent the core from reacting with chlorine. The core 22 has a second end 84 which is much further from the second ends 82 and 83 than the first end 76 is from the first ends 78 and 79. Melting of the second end 84 is thus prevented when the fusion weld 80 is applied. The tubular member 18 is then turned around and the second ends 82, 83 and 84 inserted first into the channel 34. Although some light can pass through a lower portion of the tubular member 18, very little light is transmitted all the way down the channel 34 and very little light then passes through the lower portion of the tubular member 18. Very little light, by contrast, can pass through an upper end of the tubular member 18 because the first end 76 of the core 22 is so close to the first ends 78 and 79 of the tubes 66 and 68. What little light can pass over the first end 76 of the core 22 is blocked by overhanging portions 90 of the wafer seat 40 located on opposite sides of the tubular member 18.

It can thus be seen that light emanating from the halogen light 14 is blocked from reaching a location where the pyrometer 16 detects temperature. The light is blocked with a member which is resistant to reaction with chlorine and which has a thermal conductivity which is low enough to protect the magnet 38A.

What is claimed is:

1. A semiconductor processing system comprising:

a semiconductor processing chamber;

a light source positioned to heat a wafer when located within the chamber;

a temperature detector measuring a temperature at a location within the chamber; and a member, located within the chamber, which shields the location from light emanating from the light source, the member having a translucent shell and an opaque core.

2. The system of claim 1 wherein the shell is resistant to reaction with chlorine.

3. The system of claim 1 wherein the shell is made of quartz.

4. The system of claim 1 wherein the member shields light emanating from the light source after the light reflects from at least one surface.

5. The system of claim 1 which includes a seat for a semiconductor wafer and movement of the member causes movement of the seat.

6. The system of claim 5 which includes a component in contact with the member wherein the member is moved when the component is magnetized.

7. The system of claim 5 wherein a wafer, when located on the seat, and the member jointly shield the location from light emanating from the light source.

8. The system of claim 7 wherein the member is a substantially vertically extending tubular member, the seat is supported by an upper end of the member and the temperature detector is located within a volume defined within the member.

9. The system of claim 5 wherein the seat and the shell have thermal conductivities wherein the thermal conductivity of the seat is higher than the thermal conductivity of the shell.

10. A semiconductor processing system comprising:

a semiconductor processing chamber;

a vertically extending tubular member with a wall having a translucent shell and an opaque core;

a wafer seat supported by an upper end of the member so that the member, the seat and a wafer when located on the seat jointly form a light shielding housing;

a light source positioned to heat the wafer when located on the seat; and a temperature detector measuring a temperature at a location within the housing.

11. The system of claim 10 wherein the temperature detector is located within the housing.

12. The system of claim 10 wherein the seat forms part of the housing.

13. A semiconductor processing system comprising:

a semiconductor processing chamber;

a component within the chamber;

a member which is moved by the component when the component is magnetized;

a wafer seat in contact with the member;

a light source which is positioned to heat a wafer when located on the wafer seat; and a temperature detector measuring a temperature of a location within the chamber, wherein the member has a translucent shell and an opaque core and is positioned to shield light, emanating from the light source, from reaching the location.

14. The system of claim 13 wherein the shell is made of quartz.

15. A semiconductor processing system comprising:

a semiconductor processing chamber;

a vertically extending tubular member, within the chamber, having a wall with a translucent shell and an opaque core;

a wafer seat supported by an upper end of the member, wherein the member and a wafer, when located on the seat, form a light shielding housing;

a light located externally of the housing and positioned to heat a wafer when located on the wafer seat;

a temperature detector measuring a temperature at a location within the housing; and a rotor mounted to the member for rotation of the member when the rotor is magnetized.

16. The system of claim 15 wherein the shell is made of quartz.

* * * * *